United States Patent [19]

Calhoun

[11] Patent Number: 4,631,569

[45] Date of Patent: Dec. 23, 1986

[54] MEANS AND METHOD OF REDUCING THE NUMBER OF MASKS UTILIZED IN FABRICATING COMPLEX MULTI-LEVEL INTEGRATED CIRCUITS

[75] Inventor: Donald F. Calhoun, Inglewood, Calif.

[73] Assignee: Hughes Aircraft Company, El Segundo, Calif.

[21] Appl. No.: 532,359

[22] Filed: Dec. 13, 1974

Related U.S. Application Data

[63] Continuation of Ser. No. 211,037, Dec. 22, 1971, which is a continuation of Ser. No. 16,868, Mar. 5, 1970, abandoned.

[51] Int. Cl.$^4$ .............................................. H01L 27/06
[52] U.S. Cl. ........................................ 357/45; 357/40; 357/71
[58] Field of Search ...................... 317/101 A; 29/574; 357/40, 43, 71

[56] References Cited

U.S. PATENT DOCUMENTS

| | | | |
|---|---|---|---|
| 3,303,400 | 2/1967 | Allison | 317/101 A |
| 3,423,822 | 1/1969 | Davidson et al. | 317/101 A |
| 3,434,020 | 3/1969 | Ruggiero | 317/101 A |
| 3,508,325 | 4/1970 | Perry | 317/101 A |
| 3,518,751 | 7/1970 | Waters et al. | 317/101 A |
| 3,585,712 | 6/1971 | Boncuk | 29/574 |
| 3,618,201 | 11/1971 | Makimoto et al. | 29/577 |
| 3,641,661 | 2/1972 | Canning | 29/574 |
| 3,835,530 | 9/1974 | Kilby | 29/574 |

FOREIGN PATENT DOCUMENTS 1117579  6/1968  United Kingdom ........... 317/101 A

*Primary Examiner*—David Smith, Jr.
*Attorney, Agent, or Firm*—Lewis B. Sternfels; A. W. Karambelas

[57] ABSTRACT

A plurality of integrated circuit wafers each having a plurality of cells disposed in a rectilinear array with the yield distribution of usable cells varying from wafer to wafer but in which there is a common yield distribution of at least Y usable cells or portions thereof in corresponding locations on N wafers (where Y and N are integers); a layer of electrical insulation that exposes the pads of the Y common yield distribution usable circuits to a second level of metalization which is formed into conductors by a first pad relocation mask which is common to the N wafers for effectively routing the exposed pads of the Y usable cells to master pattern circuit locations; and a layer of electrical insulation formed over the second level of metalization having master pattern vias formed therethrough which expose the pads at master pattern cell locations to a top layer of metalization formed into a common or master pattern of interconnects which interconnect the cells into the specific circuit type by a master pattern mask common to the Y wafers and a plurality of other wafers to be connected into the specific circuit type.

11 Claims, 7 Drawing Figures

MEANS AND METHOD OF REDUCING THE NUMBER OF MASKS UTILIZED IN FABRICATING COMPLEX MULTI-LEVEL INTEGRATED CIRCUITS

This is a continuation of application Ser. No. 211,037, filed Dec. 22, 1971 which, in turn, is a continuation of application Ser. No. 16,868, filed Mar. 5, 1970, now abandoned.

BACKGROUND OF THE INVENTION

This invention relates generally to fabrication of multi-level complex integrated circuits and relates more particularly to means and methods of fabricating a plurality of integrated circuit wafers having imperfect cell yields by utilizing the same common masks for fabricating the alternate layers of dielectric insulation and layers of metalization thereon.

In integrated circuit technology wafers having a nonuniform yield of good cells have heretofore been interconnected into functional circuit types by producing a plurality of masks tailored for that particular wafer yield distribution, each mask being associated with an individual alternate layer of dielectric insulation or metalization formed in a laminae on the wafer. A first one of these masks was utilized during fabrication to define and form feedthroughs or vias in a first layer of insulation exposing the pads of selected good cells at the first layer of metalization on the surface of the wafer. A second mask was utilized to form a second layer of metalization into electrical conductors associated with the vias in the first layer of insulation and cross-unders all routed to the location of vias which were subsequently formed in a second layer of insulation by a third mask. At least one (possibly more) alternate layer of metalization was formed on top of the second layer of insulation and fabricated into interconnect lines and cross-overs as defined by a fourth mask whereupon all of the selected good cells were electrically interconnected into a functionally specified complex integrated circuit.

Thus, it can be seen that this technique required that the multiple masks for each wafer had to be tailored to or laid out for a particular wafer since the yield distribution of usable cells varied from wafer to wafer.

SUMMARY OF THE INVENTION

Objects, features, and advantages of this invention can be attained with the provision of a plurality of integrated circuit wafers each having a unique yield distribution of usable cells with at least a portion Y of the usable cell being at cell locations common to N of the plurality of wafers (where Y and N are integers). A layer of dielectric insulation is formed on top of the wafer which exposes the signal connects associated with the common usable cell by means of vias formed with a first vias mask common to the yield distribution of the Y cells of the N wafers. A layer of metalization is in turn fabricated by a mask common to the yield distribution of the N wafers into a plurality of conductors which effectively route the signal connects to predetermined circuit locations preferably at master pattern circuit locations. Thereafter, another layer of dielectric insulation is formed on top of the metalization with vias formed therethrough by means of a master program via mask to expose the signal connects at the predetermined circuit locations to a top layer of metalization which is formed into electrical interconnects by a master pattern mask means having a master pattern conductor layout which is common to the N wafers and also common to signal connects at the master pattern in a second layer of metalization of all wafers that are to be connected into a specific circuit type.

One advantage of this invention is that: the number and thus the cost of unique metalization and dielectric insulation associated masks that must be generated in the production of multi-level complex integrated circuit arrays is reduced by a factor of N where N is the number of wafers that can use the same mask; thus, rather than generating 2N metalization masks and 2N insulation or via masks for N wafers, only two of each mask or four masks will suffice for the N wafers. In addition, the number and, therefore, the cost of separate times, a man and/or a computer must determine the sufficient means of routing a number Y of cells into a complex integrated circuit by means of alternate layers of insulation and metalization, is reduced by a factor of N. This is because N wafer arrays can be processed from each set of masks. Still further, a certain amount of standardization and improved reliability can result from having the number of unique masks reduced by a factor of N whereupon a more thorough verification of the mask can be justified. Consequently, if a problem should exist, it could more easily be detected on the first completed part before committing the remaining N wafers to fabrication. In addition, if it is desired, more thorough work could be justified in the specification of the mask so as to better insure their reliability and the resulting performance on the wafer.

BRIEF DESCRIPTION OF THE DRAWINGS

Other objectives, features and advantages of this invention will become apparent upon reading the following detailed description and referring to the accompanying drawings wherein.

DESCRIPTION OF A PREFERRED EMBODIMENT

Figure 1:
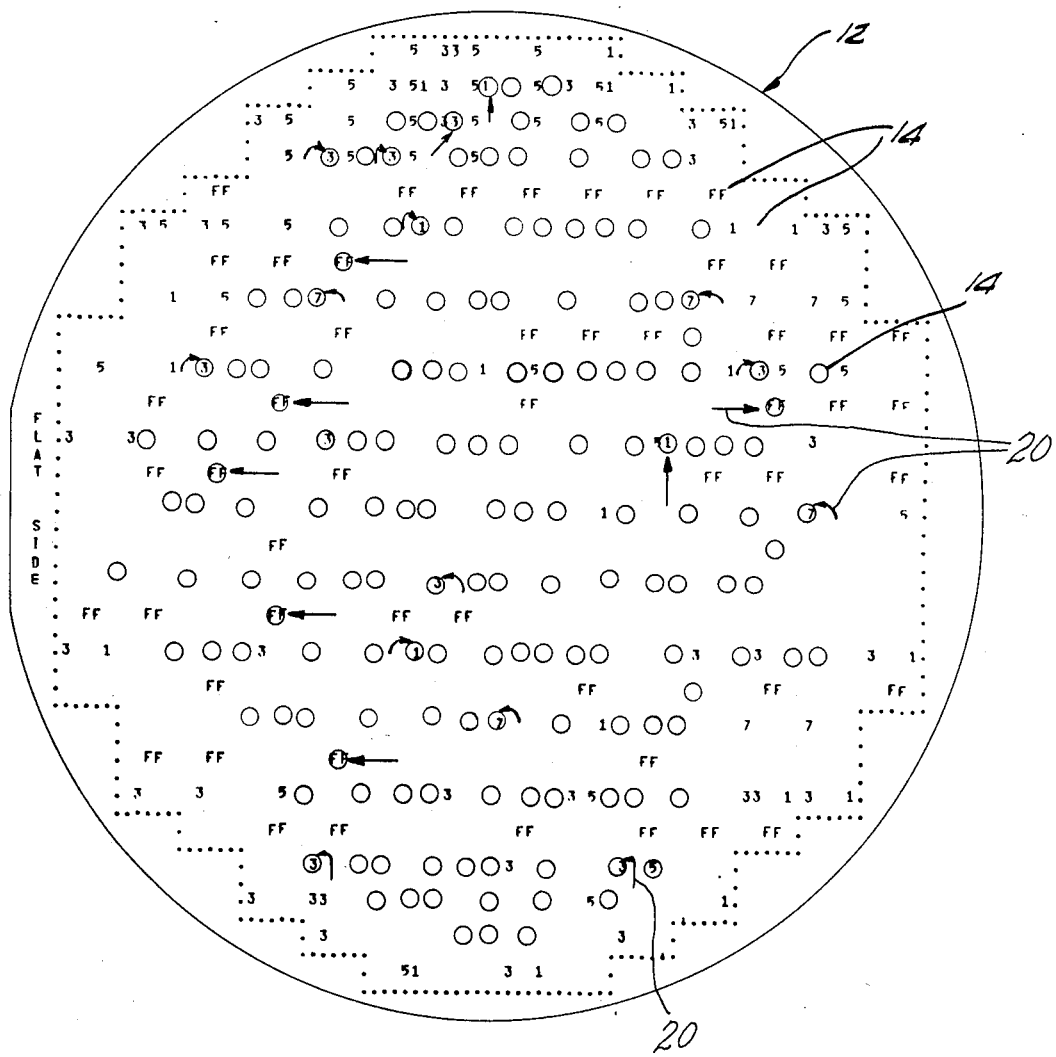
FIG. 1 is a schematic graphical illustration of one wafer of a number (N) of wafers, with numeric and letter symbols thereon indicating the actual location and yield distribution of Y usable cells which are common to the N wafers, with circles thereon indicating a master pattern of preferred circuit locations, and with directional lines indicating how selected usable cells are relocated to master pattern circuit locations as illustrated schematically by the line having arrowheads.

Referring now to the drawings in more detail, FIG. 1 illustrates an integrated circuit wafer 12 having a predominantly circular periphery except for one portion thereof which is formed as a straight edge so that the integrated circuit wafer can be properly oriented. The integrated circuit wafer 12 is further divided into a plurality of individual integrated circuit cells which, although not specifically shown in FIG. 1, are generally rectangular and, for the embodiment illustrated, arranged in a rectilinear array in a manner known in the art. A number of the cells in FIG. 1 are identified by numeric and letter symbols 14 and generally in FIGS. 2a, 3a and 3b by indicium 14. Each one of these cells can, for example, be 0.060 inch by 0.060 inch and is electrically separated from the adjacent cells by a border of electrically isolating material. The cell itself can include a plurality of active circuit elements such as semi-conductor diodes and transistors and passive elements such as conductors, resistors, and capacitors. These elements are coupled together by metalization in the wafer 12 into a predetermined circuit configuration so that, when electrical signalsf are applied to signal connects of the cells, it will operate in a predetermined manner.

Figure 2A:
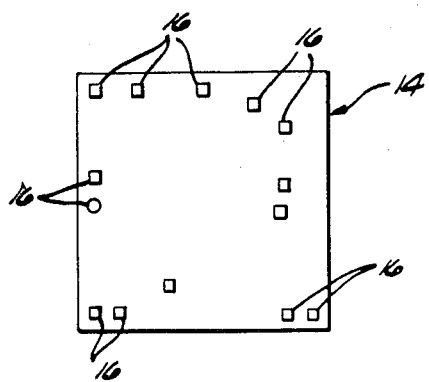
FIG. 2a is an enlarged top plan view schematically illustrating exemplary pad locations in the first layer of metalization of one of the integrated circuit cells such as represented by any of the numeric and letter symbols of FIG. 1.

In order to facilitate signal connections with the individual cells 14, each cell includes a plurality of signal connect members or pads 16, as shown in FIG. 2a, located at termination ends of signal lines. These pads 16 usually have a somewhat larger dimension and area than the signal line widths which they are associated with. For example, the pads 16 can have a dimension of 0.003 inch×0.003 inch whereas the associated conductor may only be 0.001 inch wide. There can, for example, be fourteen or possibly more or fewer of these pads 16 associated with each cell. The active and passive elements of each cell are usually arranged internally of the cell 14 so that electrical signals can be applied to some of the pads 16 whereupon a portion of the integrated circuit components can be used as a gate, flip-flop, or other circuit element; or else input or output lines can be coupled to all of the pads of a cell so that that cell operates as a complete logic circuit. Hereinafter, when the term "cell" is used, it should be understood that this is intended to cover both the entire cell or any functional portion thereof. Furthermore, in those instances where the term "usable cells" is used, it is intended to be synonymous with the term "good cells" or any portion thereof.

The yield of usable cells to total cells on the wafer 12 has heretofore been less than 100%. For example, the yield typically can be between 20% and 80% and possibly more. With such yield there is no discernible pattern the specific locations of usable cells 14 and unusable cells 14 since they are located unpredictably across the array even though there is a tendency for good cells 14 to be predominantly located toward the center of the wafer 12. Even with such a random distribution of the usable cells, there is a probability that, if N of the wafers are tested, a common yield distribution of Y usable cells will be determined on the N wafers. In other words, if the N wafers were superposed, Y of the usable cells would be in registry or superposed over each other on all N wafers. The number of wafers N so tested would vary with the percentage yield and the value of Y.

In order to determine which of the cells 14 is usable or good, they are generally tested electrically so that the good cells can be determined and properly identified. Generally a d.c. electrical test is made of each circuit to obtain adequate identification of the good circuit. In addition, further a.c. electrical testing of the good cells can be performed for added confidence in the operational capabilities of the circuit.

After electrical testing of the cells 14 has been completed, it is usually determined that the lack of common usable cells on N wafers occur in an unpredictable pattern, as exemplified and identified by the numeric and letter symbols "1", "3", "5", "7" and "FF" located above some of the rectangular integrated circuit cells 14 of FIG. 1. In this particular example: the numeric symbol "1" is representative of at least one defective one input NAND gate in the corresponding cell of the N wafers; the numeric symbol "3" is representative of a defective three input NAND gate; the numeric symbol "5" is representative of a defective five input NAND gate; the symbol numeric "7" is representative of a defective seven input NAND gate; and the letter symbol "FF" is representative of a defective flip-flop. Those cells, that are not labelled with one of the above identified symbols located therein, are representative of a common good or usable cell 14 on all N wafers, e.g., as illustrated by one indicium 14 leading to an otherwise unidentified blank space between a pair of defective cells both identified by "1" and by another indicium 14 leading to an "O" having none of the above numeric or letter symbols therein.

A master pattern of cell locations selected for a five bit sign and magnitude modular multiplier, fabricated from an exemplary integrated circuit slice part, is represented in FIG. 1 by means of one or more of a plurality of geometric symbols such as a circle "O".

Where actual common good cells 14 exist in general registry with or in coincidence with a master pattern circuit location, they are identified by the specific geometric symbol "O", as exemplified above, within one of the otherwise blank rectangular cells 14 not otherwise identified by a numeric or letter symbol. When, however, a master pattern cell location does not contain or coexist with common good cell, as represented by the specific geometric symbol " " and one of the symbols "1", "2", "5", "7" or "FF" within the same cell, it is necessary to relocate the pads 16 of a selected nearby usable cell 14 to pad locations at a master pattern circuit or cell location in a manner to be described in more detail subsequently with reference to FIG. 4. By thus effectively relocating the pads of Y common cells to master pattern cell locations for any one of the wafers, they can similarly be relocated for the remaining ones of the N wafers. Consequently, the pad relocation technique for one wafer will be described in detail.

Generally, nearby good cells 14 can be relocated to a master pattern cell location in a second layer of metalization by interconnect lines or electrical conductors 20 each laterally routed from an exposed pad 16 of the selected good cell to a corresponding pad location at the master pattern circuit location but isolated from the latter circuit by a dielectric film. Such routing of the pad relocation lines 20 is illustrated schematically in FIG. 1 by the straight line segments having arrowheads at one end and laterally extending between a selected good cell location and a master pattern cell location. It should, of course, be understood that each one of the lines 20 with arrowheads in FIG. 1 is representative of a plurality of individual interconnect lines or conductors, each of which is routed upwardly and lateraly from a pad of a good cell to a pad at the master pattern cell location as illustrated in more detail for individual pad relocation lines in FIG. 3. It should be understood that a master pattern cell or circuit location does not have to be congruent with or superposed on a wafer cell location.

As a result of the relocation of selected good cells 14 to the master pattern cell location where no good cell would otherwise be found, a common or master pattern of good cells is effectively established. This allows standard or master pattern masks of vias and interconnect lines to be used to form an additional top layer of master pattern interconnect lines for interconnecting the individual cells 14 together into a specific part type, as will be described in more detail with reference to FIG. 5.

Figure 2B:
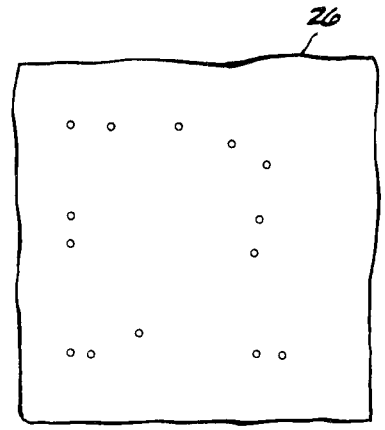
FIG. 2b is an enlarged schematic illustration of a portion of a mask of the type associated with the formation vias or feedthroughs in a layer of dielectric insulation over the cells represented in FIG. 1 for exposing the pads of a selected integrated circuit cell.
Figure 3A:
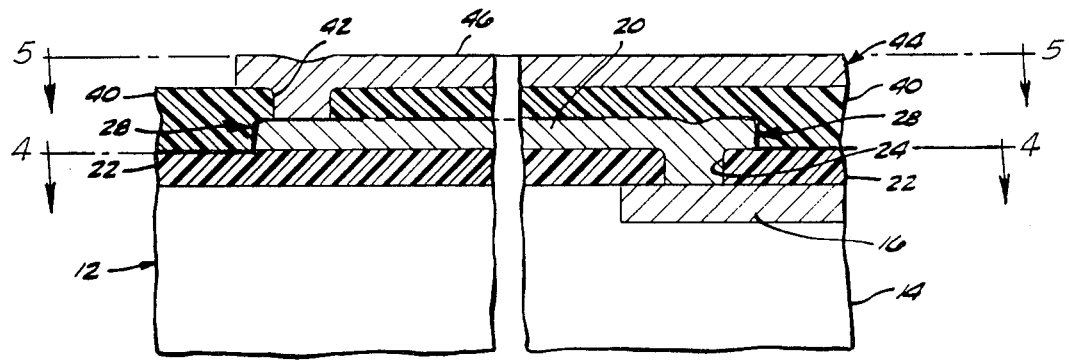
FIG. 3a is an enlarged cross-sectional side elevational view, not to scale, illustrating the relationship between the integrated circuit cell, vias in a first layer of dielectric insulation, pad relocation lines in a second layer of metalization, master pattern vias in a second layer insulation, and master pattern interconnect lines in a third layer of metalization.

Reference is now made to one such fabrication of a complex integrated circuit, specific processing details of which are described for several methods in my copending patent application now U.S. Pat. No. 3,795,972 issued Mar. 12, 1974, entitled Integrated Circuit Interconnections, By Pad Relocation. As illustrated in FIG. 3a, the first layer of metalization integral with the surface of the wafer 12 and containing the pads 16 (FIG. 2a) has a layer of dielectric insulation material 22, such as low sodium glass or quartz formed thereon, with vias 24 or feedthroughs processed therethrough in registration with the pads 16 of selected cell 14. These vias 24 are formed in the insulation 22 by a photoprocess, such as by utilizing a via mask 26 produced for that particular common yield distribution of Y usuable cells on N wafers, a portion of which is shown in FIG. 2b. This via mask 26 selectively exposes a layer of photoresist so that a portion of the photoresist remains over the selected pads 16 while the layer of insulation 22 is formed. When the photoresist is subsequently removed, vias 24 are formed through the insulation 22 which expose the pads 16.

It should be understood that the entire mask 26 for vias 24 has not been illustrated in detail in FIG. 2b since the scale on patent drawings is too small to adequately illustrate a vias aperture having an actual dimension of 0.001 inch. However, the specific location of vias 24 in the first layer of electric insulation 22 can be identified and determined by referring to FIGS. 4 and 5 wherein the vias 24 are located at the termination ends of individual conductors in the second layer of metalization that are not coincident with another terminating end of conductors in the other layer of metalization or coincident with a feedunder in the second layer of metalization when the two metalization layers of interconnects are superposed over one another.

For purposes of illustration, the enlarged cross sectional view, not to scale, in FIG. 3a schematically illustrates a via 24 extending upwardly from a pad 16 in the first layer of metalization on the face of an integrated circuit cell 14 to the second layer of metalization 28 such as, for example, aluminum which contains the laterally extending pad relocation lines 20. While a cross-sectional view of the partially fabricated or integrated wafer which is metalized to its third layer of metalization is shown in FIG. 3a (as well as FIG. 3b), the full second layer of metalization in plan or face view, looking from above and only at metalization layer 28 (thus omitting insulation 40 and third layer of metalization 44), is illustrated generally in FIG. 4. As previously mentioned with reference to FIG. 1, these pad relocation lines 20 are each routed from pads 16 of selected usable cells to a master pattern circuit location. These master pattern circuit or cell locations include not only areas congruent to and superposed over wafer cells 14 but also include areas above the wafer not in registry with or superposed over any one cell or bounded by any cell. For example, such master pattern locations can be the relocated signal connect ends or pads of the pad relocation conductors 20. Although these pad relocation lines are typically straight line segments 0.003 inch wide on 0.004 inch centers extending parallel to rectilinear coordinates, it would be possible to use other configurations and routing. The signal connect portions of the pad relocation conductors 20 are generally dimensioned at least as wide as a pad or can be formed into enlarged area pads (FIG. 4) or can be made narrower.

Figure 3B:
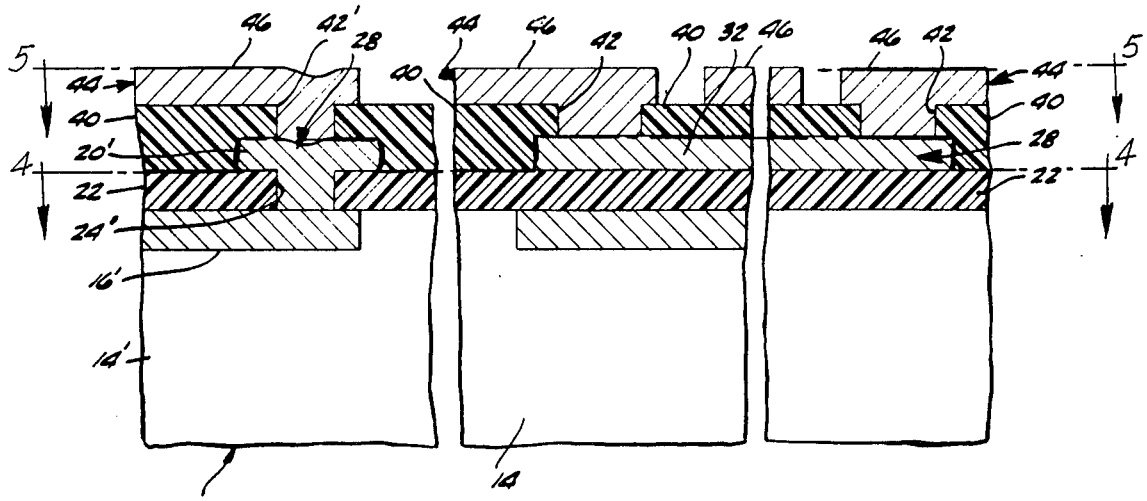
FIG. 3b is an enlarged cross-sectional side elevational view, not to scale, illustrating the relationship of the layers of dielectric insulation and vias between the pads of a usable integrated circuit cell and the master pattern interconnect line in a third layer of metalization, and in addition illustrates the relationship between master pattern vias in the second layer of insulation and cross-unders in the second layer of metalization.

Furthermore, as illustrated in FIG. 3b where a good cell, such as cell 14', coexists at a master pattern circuit location, the particular via, via 24', formed through the first layer of electrical insulation 22 merely exposes the pad, i.e., pad 16', of that good cell without necessarily requiring further routing of pad relocation line 20', such as illustrated in FIG. 3a. Thus, pad 20' is positioned directly above pad 16, when no lateral extension is required.

In addition to the pad relocation lines 20, the second layer of metalization 28 includes a plurality of crossunder conductor segments 32 located at reserved locations on the face of the first layer of insulation 22. As will be explained in more detail subsequently, some of these cross-unders 32 can cooperate with the standard pattern of interconnect lines in the third layer of metalization illustrated in full plan view in FIG. 5. As a result, all usable signal connect or logic lines must be brought to a top layer of metalization.

It should also be understood that these individual crossunder conductors 32 and pad relocation lines 20 are also formed in the second layer of metalization 28 by a photo process utilizing photoresist material and etching techiques, as described in more detail in my above referenced copending patent application. One technique is to expose the photoresist with a mask having conductors of the type illustrated in FIG. 4 tailored to the common yield distribution of Y usable cells on the N wafers wherein the master pattern circuit locations are common to a number of wafers greater than N. For example, the master pattern circuit locations can be common to all wafers in which the Y cells are to be interconnected into a specific functional circuit type.

A second layer of dielectric insulation 40, such as for example, low sodium glass or quartz, is formed on top of the second layer of metalization 28 with fixed position or master pattern vias 42 formed at master pattern circuit locations by a master pattern mask common to any number of wafers which have usable cells at master pattern circuit locations and which are to be fabricated into a specific part type. Thus, the same mask layout is not limited to use with only N wafers but can be used with a number of wafers far greater than N. A portion of these vias 42 expose the terminating ends, signal connect portions, or pads, of pad relocation lines 20 in the second layer of metalization 28 as illustrated in FIG. 3a. In addition, some of the vias, such as via 42', are superposed over the vias 24, specifically, via 24', in the first layer of electrical insulation 22, as illustrated in FIG. 3b, so that the pads 16 of the good cell in registry with the master pattern cell location are exposed to the top layer or third layer of metalization 44. In addition, some vias 42 are formed between terminating ends of standard pattern conductors 46 and the selected crossunder conductor segments 32. It should not be noted that the crossunders 32 are not otherwise connected with the pads in the first layer of metalization or with pad relocation lines 20 in the second layer of metalization. Thus, as previously stated, all signal lines are brought to the top layer of metalization 44.

Figure 4:
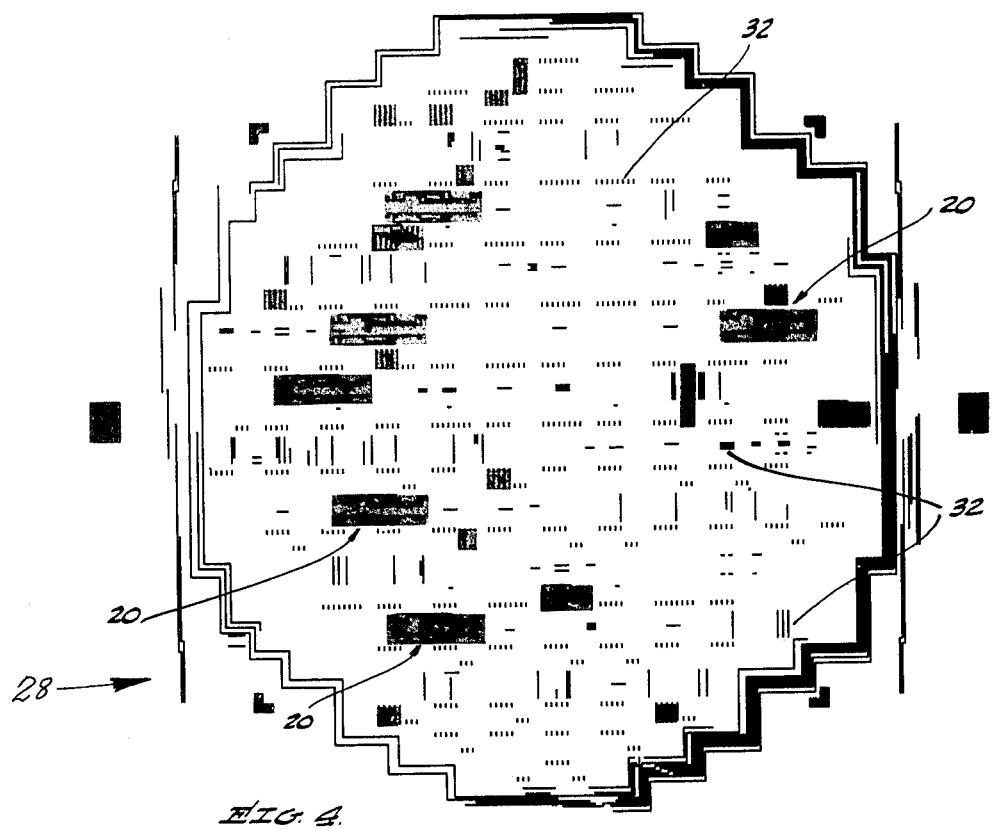
FIG. 4 is a top plan view of the second layer of metalization, a portion of which is shown in FIGS. 3a and 3b placed on a wafer, such as illustrated in FIG. 1, illustrating pad relocation lines and cross under conductor line segments formed therein.
Figure 5:
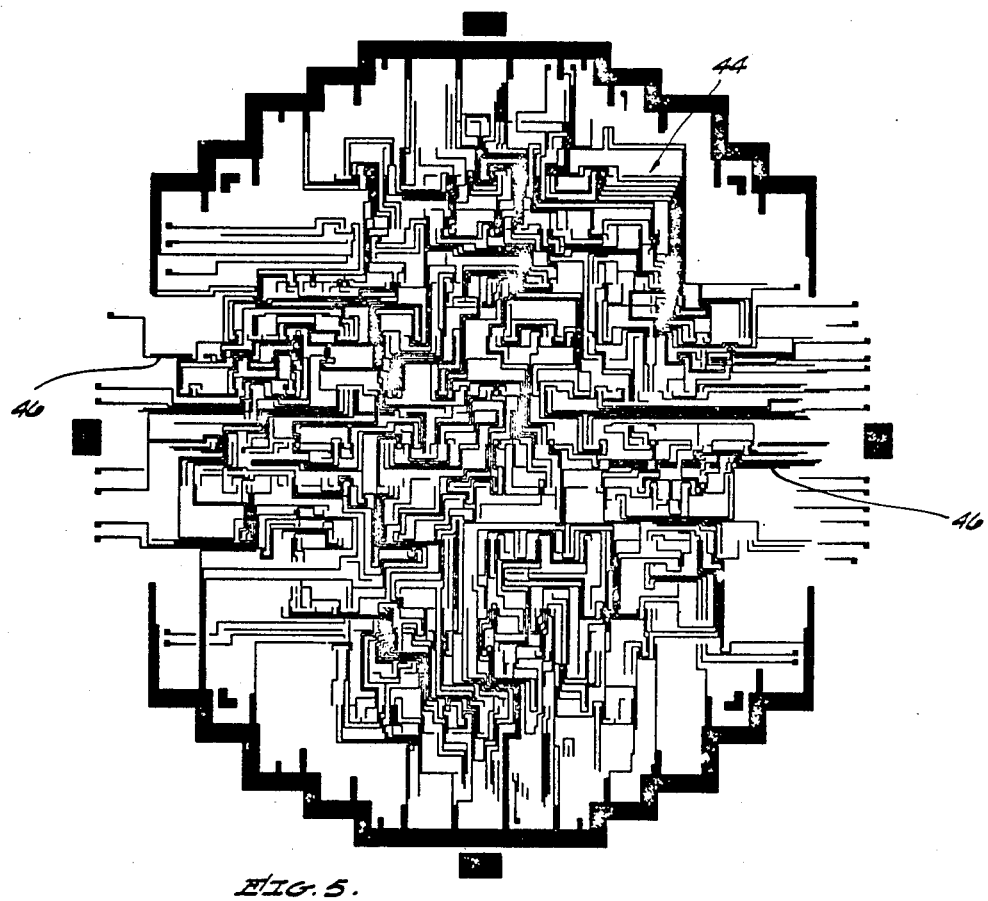
FIG. 5 is a top plan view of the third layer of the metalization, a portion of which is shown in FIGS. 3a and 3b and placed on a wafer, such as illustrated in FIG. 1, illustrating the master pattern of interconnect lines which are selectively connected to the exposed pads of usable integrated circuit cell at master circuit locations, and to cross-unders in the second layer of the metalization through the master pattern vias.

Thereafter, the top layer of third layer of metalization 44 such as, for example, aluminum, is formed on top of the second layer of dielectrical insulation 40 with the terminating ends or portions of the fixed or master pattern of interconnect lines 46 illustrated in FIG. 5 in registry with the vias 42 in the second layer of insulation 40. In a manner similar to the representation shown in FIG. 4, FIG. 5 illustrates the full third level of metalization in plan or face view, looking from above and at the top of the cross-sectional partial view of the integrated wafer of FIGS. 3a and 3b. As a result, the individual master pattern of cells, as relocated, are interconnected into a specified functional circuit which, when electrical signals are applied to the signal input thereof, will operate in a predetermined manner to produce output signals of predetermined characteristics at its output terminals. It should be understood that the standard pattern conductors or interconnect 46 in the top layer of metalization 44 are also formed with a master pattern mask common to any number of wafers having usable cells of master pattern cell locations and which are to be interconnected into a specific function part type circuit, by means of the photoresist technique in combination with etching techniques. Thus, that master pattern mask is not limited to use with only the N wafers but can be used with any number of wafers.

While silient features have been illustrated and described with respect to a particular embodiment, it should be readily apparent that modifications can be made within the spirit and scope of the invention.

What is claimed is:

1. A multi-level complex integrated circuit for defining a specific electrical function fabricated in an identical manner on each of a plurality of N (where N is an integer) wafers each having an imperfect yield of cells including usable cells distributed randomly across the surfaces of the N wafers, said usable cells terminating in signal-connects at a first level of metalization with a portion Y (where Y is an integer) of the usable cells having a common yield distribution on all N wafers, the improvement for each of the N wafers comprising:

means for defining a first layer of dielectric insulation on each of the N wafers and for defining identically located vias formed through said dielectric insulation layer only to the Y common yield usable cells at the first level of metalization, and thereby for identically exposing only the signal-connects of said Y common yield usable cells on each of the N wafers;

means for defining identically located electrical conductors in a second level of metalization on said dielectric insulation means for identical routing of said identically located electrical conductors from said exposed first level signal-connects of each of the N wafers to second level signal-connects at identical positions on each of the N wafers;

means for defining a second layer of dielectric insulation on said electrical conductor means of each of the N wafers and for defining identically located vias formed through said second dielectric insulation layer thereby for identically exposing said second level signal-connects on each of the N wafers; and means for defining identically located electrical interconnect routings in at least a further level of metalization on said second layer of dielectric insulation means and for interconnecting said exposed second level signal-connects identically on each of the N wafers, thereby for enabling performance of the specific electrical function.

2. The multi-level complex integrated circuit of claim 1, whose electrical function is incorporated in circuits which are fabricated on a quantity of wafers greater in number than the N wafers and fabricated in conformance with a master pattern having means for defining identical desired locations of usable cells for the quantity of the wafers, in which some of the cells of the N wafers are located and some thereof are not located coincident with the master pattern means, wherein all of said second level signal-connects of said N wafers are positioned at locations for defining the desired cell locations defined by the master pattern and said means for defining said identically located electrical conductors include conductor segments identically extending laterally across each of the N wafers from said exposed first level signal-connects of said non-coincident cells to said second level signal-connects, whereby said second level signal-connects are vertically aligned with said first level signal-connects of said coincident cells and said second level signal-connects are laterally displaced with respect to said first level signal-connects of said non-coincident cells in a manner identical among all said N wafers.

3. A multi-level complex integrated circuit of claim 1 in which said means for identical routing of said identically located electrical conductors include means for both vertically extending and vertically and transversely extending said conductor means identically across each of the N wafers from said first level signal-connects of the Y common yield cells to said second level signal-connects conforming to circuit locations defined by a master pattern in which the circuit locations are common to all wafers greater in number than and including the N wafers connected into the specific electrical function.

4. A plurality of integrated circuit members in which each is formed with means for enabling said members to perform the same electrical function, said enabling means comprising:

a plurality of functionally separate circuits having positions on each of said circuit members, in which some of said circuits are operable and the remainder are inoperable and in which the positions of the operable and the inoperable circuits are intermingled on each of said circuit members and in which the intermingled positions are randomly distributed from circuit member to circuit member, each of said functionally separate circuits having a plurality of primary signal-connect means associated therewith, said functionally separate operable circuits including a group of operable circuits being at least equal in number to the number of operable circuits required to perform the electrical function;

said group consisting of first and second sets of said operable circuits whose positions are at locations which are identical among all of said integrated circuit members in accordance with the statistical probability that the randomly distributed positions of said first and second sets have the locations identical among all of the said integrated circuit members;

electrical coupling means including a plurality of secondary signal-connect means otherwise electrically isolated from said functionally separate circuits and said primary signal-connect means thereof, said secondary signal-connect means having locations which are identical among all of said circuit members and which are positioned directly above said primary signal-connect means of said first set; and said electrical coupling means further including electrical conductor means having a configuration identical among all of said circuit members and coupling said secondary signal-connect means to said primary signal-connect means of said first set of said group of said operable circuits.

5. The improvement as in claim 4 wherein:

said electrical coupling means further includes a plurality of further secondary signal-connect means otherwise electrically isolated from said functionally separate circuits and said primary signal-connect means thereof, said further secondary signal-connect means having locations which are identical among all of said circuit members and which are positioned substantially laterally from said primary signal-connect means of said second set; and said electrical coupling means further includes further electrical conductor means coupling said further secondary signal-connect means to said primary signal-connect means of said second set of said group of said operable circuits.

6. The improvement of claim 4 for each of said intergrated circuit members in which said electrical conductor means is configured in accordance with the statistically expected locations of said first set of said group of said operable circuits on each of said integrated circuit members.

7. The improvement of claim 4 wherein said electrical coupling means further comprises:

means for defining a first composite layer of metalization routings and insulation on each of said integrated circuit members, including a first layer of said electrical conductor means coupled to said primary signal-connect means of said first set of said operable circuits and identically routed over each of said integrated circuit members in otherwise electrical isolation from others of said operable and inoperable circuits, the identical first locations conforming to a first layer standard pattern of said secondary signal-connect means; and means for defining a second composite layer of metalization routings and insulation on said first layer means of each of said integrated circuit members, including a second layer of second electrical conductor means selectively coupled to said secondary signal-connect means in the first standard pattern and identically routed from said secondary signal-connect means in substantial electrical isolation from said first layer of said electrical conductor means in a second standard pattern that is identical for each of said integrated circuit members having the first level standard pattern of said secondary signal-connect means, thus forming a third standard pattern further electrically interconnecting said primary signal-connect means of said first set of said group of operable circuits into a specific more complex circuit type.

8. The improvement of claim 7 in which said first composite layer means for each of said integrated circuit members further includes a first layer of dielectric material having means for defining apertures formed therethrough to said primary signal-connect means of said first set of said group of operable circuits, said first layer of said electrical conductor means being connected to said primary signal-connect means of said first set through said aperture means, said aperture means being identical among all of said circuit members.

9. The improvement of claim 8 for each of said integrated circuit members in which said first layer of said electrical conductor means is identical among all of said circuit members and is routed across the surface of said dielectric material from said primary signal-connect means of said first set of said group of operable circuits to the identical first locations forming the first level standard pattern of said secondary signal-connect means.

10. A plurality of integrated circuit members in which each is formed with means for enabling said members to perform the same electrical function, said enabling means comprising:

a plurality of functional separate circuits on each of said circuit members, said functionally separate circuits including operable and inoperable circuits, said operable and inoperable circuits being intermginged and randomly positioned on each of said circuit members, with selected ones of said operable circuits being sufficient in number for performing the same electrical function and having the same positions on all of said circuit members;

a plurality of signal-connect areas on each of said circuit members and being equal in number to said selected operable circuits, said signal-connect areas having locations identical among all of said circuit members; and electrical conductor means on each, and identical among all, of said circuit members and respectively coupling only each of said selected operable circuits to only each of said signal-connect areas.

11. A plurality of integrated circuit members each capable of performing the same electrical function and each comprising:

a plurality of circuits on each of said circuit members in which some of said circuits are used and the remainder are unused and in which said used and said unused circuits are randomly positioned on each of said circuit members; and means for defining integration of said used circuits into the electrical function and consisting of a plurality of first and second signal-connect areas of only selected ones of said used circuits whose locations are common to all of said circuit members.

* * * * *